United States Patent [19]

Coppens et al.

[11] Patent Number: 5,273,858
[45] Date of Patent: Dec. 28, 1993

[54] METHOD OF MAKING LITHOGRAPHIC ALUMINUM OFFSET PRINTING PLATES

[75] Inventors: Paul J. Coppens, Turnhout; Joan T. Vermeersch, Deinze; Luc H. Leenders, Herentals; Ludovicus H. Vervloet, Kessel; Eric M. Hoes; Eddie R. Daems, both of Herentals, all of Belgium

[73] Assignee: Agfa-Gevaert, N.V., Mortsel, Belgium

[21] Appl. No.: 783,244

[22] Filed: Oct. 28, 1991

[30] Foreign Application Priority Data

Nov. 2, 1990 [EP] European Pat. Off. ........ 90202900.8

[51] Int. Cl.⁵ .......................... G03C 5/54; G03C 1/94
[52] U.S. Cl. ..................................... 430/204; 430/227; 430/231; 430/244; 430/248; 430/207; 430/263; 430/256; 430/526
[58] Field of Search ............... 430/204, 227, 231, 244, 430/263, 525, 526, 207, 256, 248

[56] References Cited

U.S. PATENT DOCUMENTS 4,562,140 12/1985 Kohmara et al. ................... 430/227
4,614,708 9/1986 Timmerman et al. .............. 430/950
5,068,165 11/1991 Coppens et al. .................... 430/204

Primary Examiner—Richard L. Schilling
Attorney, Agent, or Firm—Breiner & Breiner

[57] ABSTRACT

Method for making lithographic aluminum offset printing plates according to the DTR-process by photoexposing a photosensitive monosheet layer assemblage comprising a hydrophilic aluminum foil, an intermediate layer comprising hydrophobic polymer beads prepared by polymerization of ethylenically unsaturated monomer(s) and having an average diameter not lower than 0.2 μm, and a silver halide emulsion layer, applying an aqueous alkaline solution to the photo-exposed silver halide emulsion layer in the presence of a developing agent and a silver halide solvent to form a silver image and to allow unreduced silver halide or complexes formed thereof to diffuse imagewise from the developed silver halide emulsion layer to said aluminum foil to produce thereon a silver image, and separating said emulsion layer and said intermediate layer from the imaged aluminum foil. The invention also relates to the photosensitive monosheet layer assemblage used for making such printing plates.

21 Claims, No Drawings

METHOD OF MAKING LITHOGRAPHIC ALUMINUM OFFSET PRINTING PLATES

BACKGROUND OF THE INVENTION

1. Field of the Invention

The present invention relates to a method for making improved lithographic aluminium offset printing plates according to the silver complex diffusion transfer reversal process and to the photosensitive monosheet layer assemblage used for making such printing plates.

2. Description of the Prior Art

The principles of the silver complex diffusion transfer reversal process, briefly called DTR-process herein, have been described in e.g. U.S. Pat. No. 2,352,014.

A lithographic printing plate can be made according to the DTR-process. In U.S. Pat. No. 3,511,656 a method has been described for making a printing plate by photo-exposing a material comprising in the given sequence a silver halide emulsion layer, a silver-receptive stratum containing nuclei for precipitation of silver from diffusing water-soluble silver complexes, and a base sheet e.g. an aluminium foil, and applying an aqueous alkaline solution of a developing agent and silver halide solvent to the photo-exposed silver halide emulsion layer, reducing the exposed silver halide, allowing the unreduced silver halide or complexes formed thereof to diffuse from the unexposed areas of the silver halide emulsion layer to the silver-receptive stratum to produce from the unreduced silver halide or complexes formed thereof in conjunction with the nuclei a visible silver image in the silver-receptive stratum, said image being oleophilic ink-receptive, and removing the photo-exposed silver halide emulsion layer from the surface of the silver-receptive stratum with warm water. Printing can be achieved by wetting the imaged silver-receptive stratum with aqueous dampening liquid to wet out the non-imaged areas, coating the silver-receptive stratum with an ink, which wets out the imaged areas, and pressing the inked surface onto copy sheets for the transfer of the ink image thereto. It is possible also to dispense with the silver-receptive stratum containing nuclei so that the oleophilic ink-receptive image is formed directly on the base sheet e.g. an aluminium foil, the surface of which has been rendered hydrophilic previously by brushing, silicating, anodizing, etching, or the like. By treatment with a lacquer the oleophilicity of the silver image can be increased, if desired.

In U.S. Pat. No. 4,772,535 a light-sensitive lithographic printing plate material has been described, which material comprises a support e.g. a metal support, an optional subbing or antihalation layer or undercoat, a non-light-sensitive silver halide emulsion layer, a light-sensitive silver halide emulsion layer, and an image-receiving layer containing physical development nuclei. The material is exposed image-wise through the image-receiving layer and developed to form a diffusion transfer silver image in the image-receiving layer (not in the metal support). The imaged element thus obtained is used as such as a printing plate without separation of the now useless emulsion layers from the layer that contains the printing image.

According to EP-A 0,278,766 a lithographic printing plate precursor has been proposed, said precursor comprising a grained and anodized aluminium foil coated with a sol containing nuclei in a gelatin binder and—according to one embodiment—covered with a silver halide emulsion layer. Extensive experimentation with a said printing plate precursor has shown unfortunately that satisfactory printing results can only be obtained on the condition that after development of said precursor, the residual emulsion layer is removed by washing with hot water (50° C.) and that the image plate is treated with a finisher comprising large amounts (20 g/l) of trypsin. The use of hot water has several disadvantages. The cost of hot water is high. Moreover, hot water dissolves the proteinic binder, usually gelatin, of the emulsion layer, thus causing decomposition of said layer so that a dirty black waste water comprising silver particles and dissolved silver salts is obtained, which upon cooling may clog filters and draining pipes. As for trypsin, this is a proteolytic enzyme that should be present in the finisher to degrade or decompose the proteinic binder that has adsorbed onto the silver grains precipitating on the aluminium foil during image formation. Substantial amounts of proteinic binder can indeed easily reach the silver grains owing to the fact that a silver-receptive stratum comprising gelatin and a gelatin silver halide emulsion layer have been coated directly on the aluminium foil. After oleophilization of said silver image the adsorbed gelatin, which is inherently hydrophilic, constitutes an undesired hydrophilic element in the master image so that prints having an insatisfactory quality are obtained. Moreover, said trypsin, which is essential to degrade the proteinic binder in the silver image, is extraordinarily expensive and is ecologically harmful as can be derived from i.a. Sigma Aldrich Library of Chemical Safety Data: MSO Book, 2.35553A,B,C and from Registry of Toxic Effects of Chemical Substances, YN507500.

In addition to the above disadvantages it has also been established that the gelatin present in substantial amounts in the nuclei-containing layer and in the emulsion of the lithographic printing plate precursor layer has a corrosive effect on the aluminium foil. The corrosive effect of gelatin on aluminium has indeed been described by J. H. Penn and G. A. W. Murray in Br. Corros. J., 1967, Vol.2, September, pages 193-4. Even though the corrosive influence of gelatin on the aluminium foil may be limited thanks to the presence of the anodization layer thereon, this protection is incomplete owing to random defects in the continuity of the anodization layer.

Furthermore, it is generally known that aluminium ions have a hardening influence on gelatin (see e.g. the paragraph bridging pages 78 and 79 of "The Theory of the Photographic Process" 4th Ed., edited by T. H. James). Aluminium ions of the foil can indeed cause a hardening reaction in the gelatin layers so that removal of the emulsion layer gradually becomes more difficult.

Finally, as a result of the corrosive effect of gelatin on aluminium and the hardening reaction caused by aluminium in the gelatin layers, the shelf-life of the lithographic printing plate precursor is limited substantially.

According to U.S. Ser. No. 07/552,945, now U.S. Pat. No. 5,068,165, these disadvantages have been circumvented for the major part by providing between the aluminium foil and the silver halide emulsion layer a thin water-swellable intermediate layer comprising for at least 70% of its total weight at least one non-proteinic hydrophilic film-forming polymer.

However, since on a microscopic scale the grained surface of an aluminium foil is very rugged with deep valleys and steep peaks, it is practically impossible to completely cover this rugged aluminium surface with just a thin water-swellable intermediate layer. It was, therefore, tried to fill up this ruggedness by enhancing the thickness of the water-swellable intermediate layer, but although a thicker intermediate layer offered a solution with respect to creating a more efficient barrier between the aluminium surface and the emulsion layer, it led to another disadvantage. During diffusion transfer the silver salts migrating from the emulsion layer to the aluminium surface through the thick water-swollen intermediate layer have to cover a longer diffusion path so that lateral diffusion becomes more substantial. As a consequence, the deposition of silver on the aluminium surface and the sharpness of the transferred silver image are reduced.

SUMMARY OF THE INVENTION

It is therefore an object of the present invention to provide an improved method for making lithographic aluminium printing plates according to the DTR-process in a convenient and ecologically as well as economically acceptable way.

It is another object of the present invention to provide a photosensitive monosheet layer assemblage for making a lithographic aluminium printing plate, by which sharp high quality prints can be made according to the DTR-process, said photosensitive monosheet layer assemblage having an improved shelflife.

These and other objects are achieved by providing an improved method for making lithographic aluminium offset printing plates according to the DTR-process comprising the steps of:
(a) photo-exposing a photosensitive monosheet layer assemblage comprising:
   a hydrophilic grained and anodized aluminium foil,
   an intermediate layer comprising hydrophobic polymer beads prepared by polymerization of at least one ethylenically unsaturated monomer and having an average diameter not lower than 0.2 $\mu$m, and
   at least one silver halide emulsion layer,
(b) applying an aqueous alkaline solution to the photo-exposed silver halide emulsion layer in the presence of at least one developing agent and at least one silver halide solvent to form a silver image and to allow unreduced silver halide or complexes formed thereof to diffuse image-wise from the developed silver halide emulsion layer to said hydrophilic grained and anodized aluminium foil to produce thereon a silver image, and
(c) separating said at least one emulsion layer and said intermediate layer from the imaged hydrophilic grained and anodized aluminium foil.

In the above step (c) said separating can be accomplished e.g. by the steps of:
bringing said monosheet layer assemblage with its side showing said at least one emulsion layer during the period of time starting with the application of said aqueous alkaline solution and ending with said formation of a silver image on said hydrophilic grained and anodized surface in contact with a receiving means, said at least one emulsion layer and said intermediate layer being wet with said aqueous alkaline solution having an adherence to said receiving means that is stronger than that to the imaged hydrophilic grained and anodized aluminium foil and
peeling off said at least one emulsion layer and said intermediate layer adhering to said receiving means from the imaged hydrophilic grained and anodized aluminium foil, or by the steps of:
removing said monosheet layer assemblage from the alkaline solution-applying means after completion of said formation of a silver image on said hydrophilic grained and anodized aluminium foil and
detaching said at least one emulsion layer and said intermediate layer from the imaged hydrophilic grained and anodized aluminium foil with the aid of unheated water or unheated aqueous medium, or by the steps of:
removing said monosheet layer assemblage from the alkaline solution-applying means after completion of said formation of a silver image on said hydrophilic grained and anodized aluminium foil and
detaching said at least one emulsion layer and said intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminium foil with the aid of an air current directed onto an edge of said monosheet layer assemblage.

The imaged hydrophilic grained and anodized aluminium foil can be used for making prints as follows:
treating said imaged aluminium foil by rubbing with a fixer to enhance the water-receptivity of the non-image areas and to make the image areas oleophilic ink-receptive,
wetting said imaged aluminium foil with an aqueous dampening liquid to wet out the non-imaged areas,
coating said imaged aluminium foil with an ink that wets out the imaged areas, and
pressing the inked surface of the resulting lithographic aluminium offset printing plate in an offset press onto a blanket that transfers the ink onto copy sheets.

The present invention also provides a photosensitive monosheet layer assemblage for making a lithographic aluminium printing plate according to the DTR-process, said assemblage comprising in the given sequence a hydrophilic grained and anodized aluminium foil and at least one silver halide emulsion layer, wherein an intermediate layer comprising hydrophobic polymer beads prepared by polymerization of at least one ethylenically unsaturated monomer and having an average diameter not lower than 0.2 $\mu$m is provided between said hydrophilic grained and anodized aluminium foil and said at least one silver halide emulsion layer.

The photosensitive monosheet layer assemblage according to the present invention can be made by coating a hydrophilic grained and anodized surface of an aluminium foil with an intermediate layer comprising hydrophobic polymer beads prepared by polymerization of at least one ethylenically unsaturated monomer and having an average diameter not lower than 0.2 $\mu$m, and coating said intermediate layer with at least one silver halide emulsion layer.

According to another embodiment the said photosensitive monosheet layer assemblage can be prepared by the steps of:
coating a temporary base with at least one silver halide emulsion layer,
coating said at least one silver halide emulsion layer with an intermediate layer comprising hydrophobic polymer beads prepared by polymerization of at least one ethylenically unsaturated monomer and having an average diameter not lower than 0.2 μm, and pressing the thus formed photosensitive layer packet with its side carrying said intermediate layer against the hydrophilic grained and anodized surface of an aluminium foil, which has been wet with an aqueous moistening liquid, the said temporary base being removed before or after said photo-exposure.

The invention thus also provides a photosensitive layer packet intended for making a lithographic aluminium printing plate according to the DTR-process, wherein said photosensitive layer packet comprises a temporary base temporarily carrying a separable layer sandwich comprising in the given sequence at least one silver halide emulsion layer and an intermediate layer comprising hydrophobic polymer beads prepared by polymerization of at least one ethylenically unsaturated monomer and having an average diameter not lower than 0.2 μm, said layer sandwich being transferable onto a wet separate hydrophilic grained and anodized aluminium foil when pressed thereon. The temporary base can be peeled off before or after photo-exposure of the silver halide emulsion layer(s).

DETAILED DESCRIPTION OF THE INVENTION

The method of the invention for making prints according to the DTR-process by means of an improved lithographic aluminium offset printing plate comprises the consecutive steps of:

(1) making a photosensitive monosheet layer assemblage e.g. by the steps of:

coating the hydrophilic grained and anodized surface of an aluminium foil, preferably after having applied thereto a silver-receptive stratum containing development nuclei for precipitation of silver from diffusing water-soluble silver complexes, with an intermediate layer comprising hydrophobic polymer beads having an average diameter not lower than 0.2 μm and having been prepared by polymerization of at least one ethylenically unsaturated monomer e.g. chosen from the group consisting of alkyl methacrylates e.g. methyl methacrylate, ethyl methacrylate, propyl methacrylate, butyl methacrylate and the higher methacrylates such as stearyl methacrylate, substituted alkyl methacrylates e.g. hydroxyethyl methacrylate, alkyl acrylates, substituted alkyl acrylates, styrene, substituted styrene e.g. chlorostyrene, vinyltoluene ans substituted vinyltoluene e.g. vinylbenzyl chloride and the homologues thereof, butadiene, substituted butadiene e.g. chlorobutadiene, 2-methylbutadiene, isobutylene, and substituted isobutylene, and vinylpyridine e.g. 2- and 4-vinyl-pyridine, said intermediate layer preferably comprising an antihalation dye or pigment, and coating said intermediate layer with at least one silver halide emulsion layer, at least one silver halide emulsion layer being photosensitive and optionally comprising a light-screening dye, or by the steps of:

coating a temporary base, preferably a cellulose triacetate or polyethylene terephtalate film base, with at least one silver halide emulsion layer, at least one silver halide emulsion layer being photosensitive and optionally comprising a light-screening dye, coating said at least one silver halide emulsion layer with an intermediate layer comprising hydrophobic polymer beads having an average diameter not lower than 0.2 μm and having been prepared by polymerization of at least one ethylenically unsaturated monomer, said intermediate layer optionally comprising an antihalation dye or pigment, pressing the thus formed photosensitive layer packet with its side carrying said intermediate layer against the hydrophilic grained and anodized surface of an aluminium foil, which has been wet with an aqueous moistening liquid that may comprise additives, removing said temporary base to leave a photosensitive monosheet layer assemblage supported by said aluminium foil and optionally drying said photosensitive monosheet layer assemblage supported by said aluminium foil, (2) photo-exposing the thus formed photosensitive monosheet layer assemblage, (3) applying an aqueous alkaline solution to the photo-exposed silver halide emulsion layer in the presence of at least one developing agent and at least one silver halide solvent to form a silver image and to allow unreduced silver halide or complexes formed thereof to diffuse image-wise from the developed silver halide emulsion layer to said hydrophilic grained and anodized surface to produce thereon a silver image preferably under the catalytic influence of development nuclei, (4) separating said at least one emulsion layer and said intermediate layer from the imaged hydrophilic grained and anodized surface, said separating being accomplished e.g. by the steps of:

bringing said monosheet layer assemblage with its side showing said at least one emulsion layer during the period of time that starts with the application of said aqueous alkaline solution and ends with said formation of a silver image on said hydrophilic grained and anodized surface in contact with a receiving means, said at least one emulsion layer and said intermediate layer being wet with said aqueous alkaline solution having an adherence to said receiving means that is stronger than that to the imaged hydrophilic grained and anodized surface and peeling off said at least one emulsion layer and said intermediate layer adhering to said receiving means from the imaged hydrophilic grained and anodized surface, or by the steps of:

removing said monosheet layer assemblage from the alkaline solution-applying means e.g. a bath or a roller system such as a lick roller, after completion of said formation of a silver image on said hydrophilic grained and anodized surface and detaching said at least one emulsion layer and said intermediate layer from the imaged hydrophilic grained and anodized surface with the aid of unheated water or unheated aqueous medium, said detaching being performed e.g.:

according to a preferred mode, by rinsing with a spray or jet of unheated water or unheated aqueous medium directed onto said at least one emulsion layer and said intermediate layer, or by agitating or shaking a tray comprising said monosheet layer assemblage immersed in unheated water or unheated aqueous medium, or agitating said monosheet layer assemblage while being immersed in unheated water or unheated aqueous medium, according to another preferred mode, by pressing said monosheet layer assemblage with its side showing said at least one emulsion layer, while being moistened with unheated water or unheated aqueous medium, against a receiving sheet such as a polyethylene-coated paper sheet and peeling off said receiving sheet together with said at least one emulsion layer and said intermediate layer, which remain strongly adhering to said receiving sheet, from said imaged aluminium foil, the mechanical effect obtained by said rinsing or agitating or pressing against a receiving sheet and peeling off, being sufficient to eliminate said at least one emulsion layer and said intermediate layer from the imaged hydrophilic grained and anodized surface, or by the preferential steps of:

removing the monosheet layer assemblage from the alkaline solution-applying means e.g. a bath or a roller system such as a lick roller, after completion of said formation of a silver image on said hydrophilic grained and anodized surface and detaching said at least one emulsion layer and said intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminium foil with the aid of an air current directed onto an edge of said monosheet layer assemblage.

the mechanical effect obtained by said air current being sufficient to eliminate said at least one emulsion layer and said intermediate layer from the imaged hydrophilic grained and anodized surface, (5) treating said imaged surface by rubbing it with a fixer to enhance the water-receptivity of the non-image areas and to make the image areas oleophilic ink-receptive, (6) wetting said imaged surface with an aqueous dampening liquid to wet out the non-imaged areas, (7) coating said imaged surface with an ink that wets out the imaged areas, and (8) pressing the inked surface of said resulting lithographic aluminium offset printing plate in an offset press onto a blanket that transfers the ink onto copy sheets.

An above-described embodiment of the method of the invention comprises the following consecutive steps:

making a photosensitive monosheet layer assemblage by coating a temporary base successively with at least one silver halide emulsion layer and a said intermediate layer, next pressing the thus formed photosensitive layer packet against an aluminium foil, which has been wet with an aqueous moistening liquid, to transfer said intermediate layer and said emulsion layer onto said wet foil, removing said temporary base to leave a photosensitive monosheet layer assemblage supported by said aluminium foil, photo-exposing the thus formed photosensitive monosheet layer assemblage.

It has, however, been found that this sequence of steps may be altered in the sense that said temporary base is not removed before the photo-exposure step. Thus, according to this interesting variant said photosensitive layer packet is pressed against a wet aluminium foil to transfer said intermediate layer and said emulsion layer onto said wet foil, the aluminium side of the resulting sandwich is dried slightly, and the photo-exposure of the sandwich is then performed through said temporary base, which for this embodiment obviously is a transparent film base. It is further possible to expose the photosensitive silver halide emulsion layer(s) on the temporary base, then to press the packet against the wet aluminium foil, and finally to remove the temporary base. Thanks to the presence of the temporary base the silver halide emulsion layer(s) find themselves protected from mechanical deformation, especially in wet condition.

The invention also provides a photosensitive monosheet layer assemblage for making a lithographic aluminium printing plate for use according to the DTR-process, said assemblage comprising in the given sequence:

a hydrophilic grained and anodized aluminium foil, the anodization layer of which may be coloured with an antihalation dye or pigment, optionally a silver-receptive stratum containing development nuclei for precipitation of silver from diffusing water-soluble silver complexes, which stratum may comprise an antihalation dye or pigment, at least one silver halide emulsion layer, at least part of the silver halide emulsion being photosensitive and optionally comprising a light-screening dye, wherein an intermediate layer is provided between on the one hand said silver-receptive stratum or in the absence of said silver-receptive stratum said hydrophilic grained and anodized surface and on the other hand said at least one silver halide emulsion layer, said intermediate layer comprising hydrophobic polymer beads having an average diameter not lower than 0.2 μm and having been prepared by polymerization of at least one ethylenically unsaturated monomer, said intermediate layer optionally comprising an antihalation dye or pigment and optionally comprising a matting or spacing agent. Preferably, said intermediate layer in dry condition comprises said hydrophobic polymer beads in an amount of up to 80% of its total weight.

The invention further provides a photosensitive layer packet and a separate hydrophilic grained and anodized aluminium foil, together intended for use in transferring a transferable layer sandwich of said photosensitive layer packet by separation from a temporary base onto said separate hydrophilic grained and anodized aluminium foil in wet condition to form a photosensitive monosheet layer assemblage therewith for making a lithographic aluminium printing plate for use according to the DTR-process. Said photosensitive layer packet comprises a temporary base temporarily carrying a said separable layer sandwich comprising in the given sequence at least one silver halide emulsion layer, at least part of the silver halide emulsion being photosensitive and optionally comprising a light-screening dye, and an intermediate layer comprising hydrophobic polymer beads prepared by polymerization of at least one ethylenically unsaturated monomer and having an average diameter not lower than 0.2 μm, said intermediate layer optionally comprising an antihalation dye or pigment and optionally comprising a matting or spacing agent, and said layer sandwich being transferable onto said wet separate aluminium foil when pressed thereon. Preferably, said intermediate layer in dry condition comprises said hydrophobic polymer beads in an amount of up to 80% of its total weight.

As referred to hereinbefore the removal of the temporary base can be delayed until the photo-exposed material is to be treated with the aqueous alkaline solution.

It has been established that thanks to the presence of the thin layer comprising hydrophobic polymer beads prepared by polymerization of at least one ethylenically unsaturated monomer and having an average diameter not lower than 0.2 μm as an intermediate layer between on the one hand said silver-receptive stratum or in the absence of said silver-receptive stratum said hydrophilic grained and anodized surface and on the other hand said at least one silver halide emulsion layer, an efficient barrier is formed against the mutual above-mentioned adverse effects that a proteinic binder, usually gelatin, and aluminium exert on each other when in contact with one another. By eliminating or reducing these adverse effects in this way the shelf-life of the photosensitive monosheet layer assemblage is increased considerably. It is self-evident that when the above-defined photosensitive layer packet and separate aluminium foil are used, the contact between the proteinic binder and aluminium is excluded during storage of the separate materials so that the above-mentioned adverse effects cannot occur. Thanks to the elimination or reduction of these adverse effects the printing plates made according to any of the embodiments of the method of the present invention yield prints having a high quality. Moreover, no ecologically harmful substances such as enzymes e.g. trypsin have to be incorporated into the finisher liquids such as e.g. the fixer, which are needed to prepare the printing plate. Furthermore, the process is convenient and economically interesting in that no hot water is needed. Since the rinsing water or aqueous medium may be in unheated condition, it does not dissolve the proteinic binder of the developed emulsion layer. In fact the emulsion layer detaches in the form of swollen flakes that can easily be filtered from the rinsing water or aqueous medium. No clogging of filters and draining pipes can be occasioned. After filtration the rinsing water or aqueous medium is clear and non-pollutant and comprises substantially no silver particles nor silver salts so that it may be discharged in the sewage. By the term "unheated" as used herein in connection with the rinsing water or aqueous medium is meant that no external heating means are applied for heating said water or aqueous medium. However, it is self-evident that the invention also encompasses the use of warm water.

Due to the thinness of the intermediate layer lateral diffusion therein of the migrating silver salts during diffusion transfer is neglegible so that sharp transfer images are obtained on the aluminium surface. As a result, sharp high quality prints can be made with the aluminium printing plates.

The mechanical effect either obtained by said rinsing with a spray or jet directed onto said at least one emulsion layer and said intermediate layer or obtained by said agitation or shaking or obtained by said pressure against said receiving sheet must be sufficient to detach these layers from said imaged hydrophilic grained and anodized surface.

The hydrophobic polymer beads for use in the intermediate layer of the present invention are prepared by polymerization of at least one ethylenically unsaturated monomer. Preferred polymer beads are e.g. polymethyl methacrylate beads, polystyrene beads, ethyl acrylate/stearyl methacrylate copolymer beads, methacrylic acid/methyl methacrylate/stearyl methacrylate copolymer beads, and beads prepared as described in U.S. Pat. Nos. 4,614,708 and 4,861,818.

The average size of the hydrophobic polymer beads for use in accordance with the invention is, of course, determined by the nature of said at least one ethylenically unsaturated monomer, but can also be controlled by adjustment of other reaction parameters as described in the above-mentioned U.S. Pat. Nos. 4,614,708 and 4,861,818.

The preparation of hydrophobic polymer beads for use in accordance with the invention is illustrated by the following preparation example.

PREPARATION EXAMPLE: POLYMETHYL METHACRYLATE BEADS

At room temperature 271.73 g of a 20% by weight solution of co(styrene/maleic acid monosodium salt (pH=7) and 3752.2 g of demineralized water are mixed in a 10 l cylindrical double-walled reaction vessel. The solution is stirred by means of a rotor having a length of 15.5 cm and a width of 4 cm set at a speed of 100 rpm.

The reaction vessel is equipped with a reflux condenser and a nitrogen inlet reaching below the liquid level and is sealed. Hot water (65° C.) is fed through the double wall of the reaction vessel so that after 1 h the temperature of the solution reaches 65° C.

A continuous inlet of nitrogen keeps the solution free from oxygen.

An amount of 10.86 g of potassium persulphate is then added at once to the solution. Heating of the solution to 65° C. and stirring are continued.

After this preliminary reaction step the stirring speed is maintained at 100 rpm. Next, 21.74 g of ARKOPAL N60 commercially available from Hoechst, 2137.48 ml of methanol, and 1086.95 g of methyl methacrylate (not distilled preliminarily) are added in the given sequenve under nitrogen atmosphere.

At this very moment the following parameters should be met:
1.0 g of potassium persulphate is present per 100 g of methyl methacrylate
2.0 g of ARKOPAL N60 is present per 100 g of methyl methacrylate
the ratio by volume of methanol/water is 35/65
the concentration of monomer at the start of the reaction is 1.50 mol of methyl methacrylate per liter
the stirring speed is 100 rpm.

The temperature of the water-bath is continuously kept at 65° C. The polymerization reaction is very slightly exothermic so that the temperature in the reaction vessel rises to a maximum of 65.5° C. At this moment a weak flow of cold tap water is pumped in addition to the hot water (65° C.) into the double wall, the flow of cold water being adjusted automatically with the aid of a contact thermometer, a relay, and an automatic water valve in such a way that as soon as the temperature in the reaction vessel drops to 65° C. the flow of cold water is interrupted immediately.

At the start of the polymerization reaction the solution has a clear aspect, but after some 30 min the solution becomes turbid and then slowly and gradually turns into a milky white dispersion.

Eventually, after a total polymerization period of 18 h the supply of hot water and of nitrogen is stopped. The bead dispersion obtained is cooled by means of cold tap water to about 30° C. with continuous stirring and then filtered through a nylon cloth having a mesh width of 60×60 μm. Filtering is easy, a maximum of 2.0 g of polymer in amorphous state remaining on the cloth.

Yield: 6795 g of dispersion having 16.5 g of dry residue per 100 g of dispersion (pH=5.6). The polymethyl methacrylate beads obtained have an average diameter of 1 μm.

The presence of antihalation dyes or pigments in the intermediate layer offers the supplemental advantage that said layer loosens more easily from the imaged aluminium foil. To further improve the loosening of the intermediate layer, said layer may also comprise matting agents or spacing agents e.g. finely divided silica particles. In case the photosensitive layer assemblage consisting of a temporary base, photosensitive silver halide emulsion layer(s), and an intermediate layer is to be exposed in a vacuum contact exposure unit such matting or spacing agents also promote an effective vacuum suction.

According to a special embodiment of the present invention the intermediate layer may in addition to the hydrophobic polymer beads prepared by polymerization of at least one ethylenically unsaturated monomer also comprise an aqueous dispersion of alkali-soluble hydrophobic polymer particles, all particles having an average particle size not lower than 0.2 μm. The amount of said aqueous dispersion of hydrophobic polymer particles present in said intermediate layer may be up to 10% by weight calculated on the total weight of said layer. The use of such alkali-soluble hydrophobic polymer particles in addition to the hydrophobic polymer beads of the present invention in the intermediate layer offers the advantage that during processing of the photo-exposed emulsion layer(s) in an aqueous alkaline solution at least part of said alkali-soluble hydrophobic polymer particles are dissolved so that cavities or holes are formed in the intermediate layer, through which the diffusion transfer of migrating silver salts to the aluminium surface is facilitated. As a result, a high density buildup of transferred silver is accomplished.

Non-proteinic hydrophilic film-forming polymers may be present in the intermediate layer in an amount of e.g. up to 20% by weight of the total weight of said layer. Suitable non-proteinic hydrophilic film-forming polymers are e.g. polyvinyl alcohol, polyvinyl pyrrolidone, polyethylene oxide, partly hydrolyzed polyvinyl acetate, sulphonated polystyrene, hydroxyethyl cellulose, carboxymethyl cellulose, cellulose acetate hydrogen phthalate, dextran, dextrins or derivatives thereof, starch, gum arabic, and alginic acid derivatives such as salts or esters thereof. It is also possible to use mixtures of two or more different non-proteinic hydrophilic film-forming polymers.

According to the preferred way of separating said at least one emulsion layer and said intermediate layer from the imaged aluminium foil by means of an airstream, the process of the present invention is even more convenient and economically interesting in that the blown off layers detach as a cohesive mass that in contrast with the other separation methods of the present invention does not need any further separation or filtration from water or aqueous medium. The loosened cohesive mass dries rapidly and recovery of silver therefrom is easy and complete.

According to this preferred way of separating, the emulsion layer and intermediate layer, while both still being wet with said aqueous alkaline solution or while being moistened with unheated water or an unheated aqueous medium applied thereto subsequent to the removal of said monosheet layer assemblage from said alkaline solution, are detached from the imaged aluminium foil by means of an airstream e.g. a jet of compressed air, preferably an airstream blown from a slot orifice e.g. an air knife or air doctor, said airstream being directed onto the lengthwise or breadthwise edge of said monosheet layer assemblage. The device capable of generating the airstream used for separating the emulsion layer and intermediate layer from the imaged aluminium foil e.g. an air knife can be incorporated as a separate station in the processing apparatus. In that case the latter processing apparatus includes a station for applying aqueous alkaline solution to the photo-exposed emulsion layer and allowing unreduced silver halide or complexes formed thereof to diffuse to the aluminium foil and a said station for separating by means of an airstream. As mentioned before unheated water or an unheated aqueous medium may be applied optionally to the monosheet layer assemblage after removal thereof from said alkaline solution and prior to said detaching by means of an airstream. It is self-evident that the invention also encompasses the use of hot water.

According to the variant using said receiving sheet, the receiving sheet together with said at least one emulsion layer and said intermediate layer, which remain strongly adhering to said receiving sheet, are peeled off from said imaged aluminium foil.

The restricted softening and swelling in alkaline activating or developing solutions is due to ions such as e.g. sulphite and thiosulphate ions, which are present conventionally therein. This restricted swelling is comparable to that observed for emulsion gel layers. The typical changes in the degree of swell of an emulsion gel layer as it passes through the development in an alkaline solution causing a limited swell and subsequently through the rinsing with a water bath causing high swell have been shown in FIG. 15.17 on page 453 of "The Theory of the Photographic Process" 4th edition, edited by T. H. James, Macmillan Publishing Co., Inc. New York.

The aqueous moistening liquid used to wet said aluminium foil so that the transferable layers can be transferred thereto may consist of water or may be an aqueous solution comprising additives such as i.a. surface-active agents, a water-miscible alcohol e.g. ethanol, and hardeners including latent hardeners.

On the one hand the nature of the hydrophobic polymer beads prepared by polymerization of at least one ethylenically unsaturated monomer and having an average diameter not lower than 0.2 μm is chosen such that when a layer thereof—even a layer thereof comprising up to 20% by weight of any non-proteinic hydrophilic film-forming polymer—is immersed in said aqueous alkaline solution, whether it is an activating solution or a developing solution, softening and swelling of said layer is practically inexistent so that it remains adhering to the aluminium foil. On the other hand the nature of the hydrophobic polymer beads and of any non-proteinic hydrophilic film-forming polymer used in admixture therewith is chosen such that when:
- either a spray or jet of water or of an aqueous non-alkaline medium is directed onto said at least one emulsion layer and said intermediate layer,
- or a tray comprising said monosheet layer assemblage immersed in unheated water or unheated aqueous medium is agitated or shaken, or said monosheet layer assemblage is agitated while being immersed in unheated water or unheated aqueous medium,
- or said monosheet layer assemblage is pressed with its side showing said at least one emulsion layer, while being moistened with unheated water or unheated aqueous medium, against a receiving sheet such as e.g. a subbed cellulose triacetate film sheet, the intermediate layer is caused to detach from the aluminium foil and carry along the swollen emulsion layer(s).

For use according to the preferred method of separating the emulsion layer(s) and intermediate layer from the aluminium foil by means of an airstream, the non-proteinic hydrophilic film-forming polymer or mixture of non-proteinic hydrophilic polymers optionally present in said intermediate layer is such that when said intermediate layer is immersed in said aqueous alkaline solution, whether it is an activating solution or a developing solution, or is immersed, after having been removed from said aqueous alkaline solution, in unheated water or in an unheated aqueous medium, softening and swelling of said polymer(s) is poor and is restricted substantially to an extent that the layer containing said polymer(s) together with said hydrophobic polymer beads remains adhering to the aluminium foil. On the other hand the nature of the non-proteinic hydrophilic film-forming polymer or mixture of non-proteinic hydrophilic polymers is such that when an airstream is directed onto an edge of said monosheet layer assemblage, said layers both still being wet with absorbed aqueous alkaline solution or with subsequently applied unheated water or unheated aqueous medium, the intermediate layer detaches readily from said aluminium foil while carrying along the swollen emulsion layer(s).

The thickness of the intermediate layer may vary between wide limits. However, the coating weight of the composition for making the intermediate layer is preferably not lower than 0.1 g/m2, since otherwise an inadequate or insufficient barrier against the abovementioned adverse effects may be created. On the other hand the coating weight of the composition for making the intermediate layer preferably must not be higher than 5.0 g/m2, since owing to an increased thickness of the layer the diffusion path of the migrating silver complexes would be extended such that the chances of lateral diffusion of these migrating silver complexes would increase. Lateral diffusion may, of course, lead to insufficient sharpness of the silver image formed on the aluminium foil. Preferably, the composition for making the intermediate layer is thus coated at a ratio of from about 0.1 to about 5 g/m2.

The intermediate layer may incorporate at least one dye or pigment for antihalation purposes. The usual dyes and pigments can be chosen depending upon the desired absorption spectrum of the resulting layer relative to the spectral sensitivity of the silver halide emulsion layer(s).

The hydrophobic polymer beads of the intermediate layer can be loaded with a hydrophobic dye for antihalation purposes according to the so-called technique of loading latices with a hydrophobic substance as described in i.a. DE-A 2,541,274 and 2,541,230.

According to a preferred embodiment of the present invention the hydrophobic polymer beads of the intermediate layer can be loaded with a dye for antihalation purposes according to the method described in the EP Patent Application EP-A 483,416, filed on Nov. 2, 1990 and entitled "Method of making aqueous loaded latex compositions".

The intermediate layer may in addition to dyes or pigments and matting agents or spacing agents comprise further ingredients such as i.a. developing agents, other development ingredients, base precursors, silver halide solvents, and anticorrosive agents.

The aluminium foil of the photosensitive monosheet layer assemblage of the present invention can be made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the foil usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a centre line average value expressed in $\mu$m and preferably varies from about 0.2 to about 1.5 $\mu$m.

The anodization of the aluminium foil can be performed in electrolytes such as e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 $\mu$m. To promote the image sharpness and, as a consequence thereof, the sharpness of the final printed copy, the anodization layer may be coloured in the mass with an antihalation dye or pigment e.g. as described in JA-A 58-14797. The dye or pigment or a combination of dyes or pigments used for such colouring in the mass are chosen such that they prevent or reduce halation in silver halide emulsions having any desired photosensitivity range comprised between 300 and 900 nm.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70°-100° C. or with steam. The hot sealing water may comprise additives such as nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurrence of fog in the non-printing areas of the printing plate is avoided substantially.

The graining, anodizing, and sealing of the aluminium foil can be performed as described in e.g. U.S. Pat. No. 3,861,917 and in the documents referred to therein.

To promote the image sharpness and, as a consequence thereof, the sharpness of the final printed copy, the grained, anodized, and optionally sealed aluminium foil can be provided with a very thin antihalation coating of a dye or pigment. As already mentioned before, the usual dyes and pigments can be chosen such that they prevent or reduce halation in the silver halide emulsions used, which have any desired photosensitivity range comprised between 300 and 900 nm.

According to one embodiment the aluminium foil constitutes the sole receptor material for the silver image in that the aluminium itself takes part actively in the formation of the silver image by electrochemically reducing the transferred silver complexes. The use of such an aluminium foil as sole receptor material has been described in i.a. EP-A 0059008.

According to a frequently used alternative embodiment the grained, anodized, and optionally sealed aluminium foil can be provided with a silver-receptive stratum comprising development nuclei that initiate the physical development of the transferred silver complexes to form a silver image therein. Suitable development nuclei are sulphides of heavy metals e.g. sulphides of antimony, bismuth, cadmium, cobalt, lead, nickel, palladium, platinum, silver, and zinc. Especially suitable development nuclei are $NiS.Ag_2S$ nuclei as described in U.S. Pat. No. 4,563,410. Other suitable development nuclei are salts such as e.g. selenides, polyselenides, polysulphides, mercaptans, and tin (II) halides. Heavy metals or salts thereof and fogged silver halide are suitable as well. The complex salts of lead and zinc sulphides are active both alone and when mixed with thioacetamide, dithiobiuret, and dithiooxamide. Heavy metals, preferably silver, gold, platinum, palladium, and mercury can be used in colloidal form.

The silver-receptive stratum may incorporate at least one antihalation dye or pigment to promote the image sharpness. Again, the usual dyes and pigments can be chosen depending upon the desired absorption spectrum of the silver-receptive stratum relative to the spectral sensitivity of the silver halide emulsion layer(s) used.

The silver halide emulsion layer can be any photosensitive silver halide emulsion comprising a hydrophilic colloid binder. The photosensitive silver halide used in the present invention may comprise silver chloride, silver bromide, silver bromoiodide, silver chlorobromoiodide and the like, or mixtures thereof. To obtain a sufficiently high rate of dissolution of the silver halide and a satisfactory gradation necessary for graphic purposes a silver halide emulsion mainly comprising silver chloride is often used. This silver chloride emulsion may comprise minor amounts of silver bromide and/or silver iodide.

The silver halide emulsions may be coarse- or fine-grained and can be prepared by any of the well known procedures e.g. single jet emulsions, double jet emulsions such as Lippmann emulsions, ammoniacal emulsions, thiocyanate- or thioether-ripened emulsions such as those described in U.S. Pat. Nos. 2,222,264, 3,320,069, and 3,271,157. Surface image emulsions may be used or internal image emulsions may be used such as those described in U.S. Pat. Nos. 2,592,250, 3,206,313, and 3,447,927. If desired, mixtures of surface and internal image emulsions may be used as described in U.S. Pat. No. 2,996,382. The silver halide particles of the photographic emulsions may have a regular crystalline form such as a cubic or octahedral form or they may have a transition form. Regular-grain emulsions are described in e.g. J. Photogr. Sci., Vol. 12, No. 5, Sept./Oct. 1964, pp. 242-251. The silver halide grains may also have an almost spherical form or they may have a tabular form (so-called T-grains), or may have composite crystal forms comprising a mixture of regular and irregular crystalline forms. The silver halide grains may have a multilayered structure having a core and shell of different halide composition. Besides having a differently composed core and shell the silver halide grains may comprise also different halide compositions and metal dopants inbetween.

Two or more types of silver halide emulsions that have been prepared differently can be mixed for forming a photographic emulsion for use in a photographic material treated with a processing liquid according to the present invention.

The average size of the silver halide grains may range from 0.2 to 1.2 $\mu$m, and the size distribution can be homodisperse or heterodisperse. A homodisperse size distribution is obtained when 95% of the grains have a size that does not deviate more than 30% from the average grain size.

In addition to silver halide the emulsions may also comprise organic silver salts such as e.g. silver benzotriazolate and silver behenate.

The silver halide crystals can be doped with $Rh^{3+}$, $Ir^{4+}$, $Cd^{2+}$, $Zn^{2+}$, $Pb^{2+}$.

The photographic emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

The emulsion can be desalted in the usual ways e.g. by dialysis, by flocculation and re-dispersing, or by ultrafiltration.

Besides the silver halide another essential component of a photosensitive emulsion layer is the binder. The binder is a hydrophilic colloid, usually a protein, preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g.

other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

Apart from negative-working silver halide emulsions that are preferred for their high photosensitivity, use can be made also of direct-positive silver halide emulsions that produce a positive silver image in the emulsion layer(s) and a negative image on the aluminium foil.

For instance, direct-positive emulsions of the type described in U.S. Pat. No. 3,062,651 may be employed. In direct-positive emulsions a non-hardening fogging agent such as stannous chloride and formamidine sulphinic acid can be used.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A 493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65-72 (1951).

The emulsions can also be sensitized with polyalkylene oxide derivatives, e.g. with polyethylene oxide having a molecular weight of 1000 to 20,000, or with condensation products of alkylene oxides and aliphatic alcohols, glycols, cyclic dehydration products of hexitols, alkyl-substituted phenols, aliphatic carboxylic acids, aliphatic amines, aliphatic diamines and amides. The condensation products have a molecular weight of at least 700, preferably of more than 1250. It is also possible to combine these sensitizers with each other as described in BE-A 537,278 and GB-A 727,982.

The spectral photosensitivity of the silver halide can be adjusted by proper sensitization to any desired spectral range comprised between 300 and 900 nm by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. Hamer in "The Cyanine Dyes and Related Compounds" (1964) Interscience Publishers, John Wiley & Sons, New York. The spectral photosensitivity of the silver halide can also be adjusted for exposure by laser light e.g. helium-neon laser light, argon laser light, and solid state laser light. Dyes that can be used for adjusting the photosensitivity to laser light have been described in i.a. JA-A 62284344, 62284345, 62141561, 62103649, 62139555, 62105147, 62105148, 62075638, 62062353, 62062354, 62062355, 62157027, 62157028, 62113148, 61203446, 62003250, 60061752, 55070834, 51115821, 51115822, 51106422, 51106423, 51106425; DE-A 3,826,700; U.S. Pat. Nos. 4,501,811, 4,725,532, 4,784,933; GB-A 1,467,638; and EP-A 100,654 and in documents cited therein.

The silver halide can also be sensitized with a dye or a mixture of dyes providing a spectral sensitivity mainly in the range of 400 to 500 nm and not extending the sensitivity substantially beyond 500 nm so that the sensitivity at 530 nm is at least $10^2$ lower than that at 500 nm and that the resulting photosensitive monosheet layer assemblage can be handled in yellow safe-light conditions prior to the photo-exposure, said conditions corresponding to the light transmitted by a cut-off filter having at 500 nm a density of at least 2.5, at 530 nm a density not higher than 2.0, at 540 nm a density not higher than 1.0, at 550 nm a density not higher than 0.4, at 560 nm a density not higher than 0.2, and beyond 580 nm a density not higher than 0.1. Suitable dyes that can be used for that purpose have been described in e.g. U.S. Pat. No. 4,686,170. Image-wise exposure of silver halide emulsions sensitized in this way can be performed by means of lasers emitting below 500 nm e.g. an argon laser emitting at 488 nm. A particular advantage in the case of image-wise exposure of direct-positive silver halide emulsions sensitized with such dyes and used for the production of printing plates according to the DTR-process in general is that an economical and quick exposure by laser under yellow safelight conditions is possible, since only the areas of the direct-positive silver halide emulsions that correspond with the finally obtained printing areas or the printing plate have to be exposed and not the background areas.

The silver halide emulsions may contain the usual stabilizers e.g. homopolar or salt-like compounds of mercury with aromatic or heterocyclic rings such as mercaptotriazoles, simple mercury salts, sulphonium mercury double salts and other mercury compounds. Other suitable stabilizers are azaindenes, preferably tetra- or penta-azaindenes, especially those substituted with hydroxy or amino groups. Compounds of this kind have been described by Birr in Z. Wiss. Photogr. Photophys. Photochem. 47, 2-27 (1952). Other suitable stabilizers are i.a. heterocyclic mercapto compounds e.g. phenylmercaptotetrazole, quaternary benzothiazole derivatives, and benzotriazole.

The silver halide emulsions may comprise other ingredients e.g. antifogging agents, developers and/or development accelerators, wetting agents, and hardeners. Optionally, the silver halide emulsions may comprise matting agents or spacing agents e.g. finely divided silica particles and polymer beads as described U.S. Pat. No. 4,614,708, to promote an effective vacuum suction of the photosensitive material in vacuum contact exposure units.

Whereas according to known methods in the art it is indeed customary to substantially harden the silver halide emulsions, the binder of which usually is gelatin, to prevent an undesired transfer of gelatin to the aluminium foil, hardening is not necessary according to the present invention. The transfer of gelatin to the aluminium foil indeed gives rise to the above described disadvantages. The intermediate layer actually prevents the binder of the silver halide emulsion or emulsions from being transferred to the aluminium foil or substantially reduces such transfer. The hardening degree of the silver halide emulsion layer can thus be adjusted at wish.

The silver halide emulsion may comprise light-screening dyes that absorb scattering light and thus promote the image sharpness and, as a consequence thereof, the sharpness of the final printed copy.

Light-absorbing dyes that can be used as light-screening dyes have been described in i.a. U.S. Pat. No. 4,092,168, U.S. Pat. No. 4,311,787, DE-A 2,453,217, and GB-A 7,907,440. Alternatively, light-absorbing dyes can be incorporated into a thin supplemental intermediate layer provided between said at least one silver halide emulsion layer and said intermediate layer. Again, the light-screening dyes or light-absorbing dyes can be chosen depending upon the desired absorption spectrum of the layer comprising them.

More details about the composition, preparation and coating of silver halide emulsions can be found in e.g. Product Licensing Index, Vol. 92, December 1971, publication 9232, p. 107–109.

As an Anteresting variant the silver halide emulsion may consist of a first photosensitive direct-positive or negative silver halide emulsion in which a normal latent image is formed upon image-wise exposure and a second low-speed silver halide emulsion whose speed is so low that no or almost no latent image is formed therein. When the low-speed silver halide emulsion and the photosensitive silver halide emulsion are coated to form different layers, the resulting emulsion layers are arranged in such a way that the low-speed emulsion is remotest from the aluminium foil. It is also possible to coat one single layer comprising a mixture of said photosensitive silver halide emulsion and said low-speed silver halide emulsion.

Thanks to the combination of photosensitive and low-speed emulsions a higher amount of silver can migrate to form the silver image on the aluminium foil. As a result, an enhanced contrast and a high resistance against mechanical wear are obtained. It has indeed been established that upon application of an aqueous alkaline solution to the image-wise exposed photosensitive silver halide emulsion in the presence of a developing agent and a silver halide solvent a silver image is formed therein and that the unreduced silver halide or complexes formed thereof diffuse from the non-silver image areas to said hydrophilic grained and anodized aluminium foil and that additionally silver halide or complexes formed thereof diffuse from the low-speed emulsion through the non-silver image areas of the photosensitive silver halide emulsion also to the aluminium foil, the silver image areas of the photosensitive emulsion forming a barrier for silver halide or complexes of the low-speed emulsion that would also tend to migrate towards the aluminium foil. As a result, the silver halide or complexes thereof diffusing from both the photosensitive emulsion and the low-speed emulsion together build up said strengthened high-contrast silver halide on the aluminium foil.

The low-speed silver halide emulsion is a silver chloride-containing emulsion, the speed of which is so low, that no visible image is formed therein under the conditions of exposure and development of the photosensitive silver halide emulsion layer. Inasmuch as the sensitivity of the silver chloride-containing emulsion must be low, no second ripening or after-ripening thereof is needed. The low-speed silver chloride-containing emulsion, which is rinsed to be free of excess salts, preferably is a fine-grain silver chloride-containing emulsion having a particle size in the range of 50 to 500 nm.

The low-speed emulsion may be a pure silver chloride emulsion or an emulsion of mixed silver halides comprising silver chloride e.g. a silver chlorobromide or chlorobromoiodide emulsion. However, the low-speed emulsion preferably is a silver chloride emulsion for the greater part.

In case a mixture of low-speed emulsion and of imaging emulsion is coated to form one single layer, the amount of low-speed emulsion may vary within wide limits. Favourable results can be obtained when the ratio of low-speed silver chloride-containing emulsion to image-forming emulsion, expressed in parts by weight of silver nitrate, ranges from 10:1 to 1:1. The amount of low-speed emulsion to be added depends i.a. on its own nature, on the type of image-forming emulsion used, and on the effect desired. It can be determined easily by routineers in the art by making a few comparative tests.

When separate layers of low-speed emulsion and of imaging emulsion are used, the ratio expressed in parts by weight of silver nitrate of said different layers, also ranges from 10:1 to 1:1.

An optional supplemental intermediate layer, which may be present between said at least one silver halide emulsion layer and said intermediate layer comprising the hydrophobic polymer beads according to the present invention, may incorporate one or more ingredients such as i.a. antihalation dyes or pigment, developing agents, silver halide solvents, base precursors, and anticorrosion substances.

With respect to the above-mentioned embodiment of the present invention, according to which a temporary base is coated first with at least one silver halide emulsion layer and next with said intermediate layer comprising hydrophobic polymer beads, and according to which the resulting photosensitive layer packet comprising said intermediate layer and said at least one silver halide emulsion layer is transferred onto the wet hydrophilic grained and anodized surface of an aluminium foil, the following particulars can be given.

The adherence of said at least one silver halide emulsion layer to said temporary base should be such that an easy stripping off from the temporary base is possible after pressing said photosensitive layer packet against said wet hydrophilic grained and anodized aluminium foil. Therefore, a relatively hydrophobic temporary base is used, which preferably is flexible and is made of i.a. cellulose triacetate, polystyrene, polyester e.g. polyethylene terephthalate, and copoly(vinyl acetate/vinyl chloride). Preferably, the temporary base is an unsubbed cellulose triacetate or polyethylene terephthalate film base. The thickness of the cellulose triacetate or polyethylene terephthalate film base may vary between wide limits, but preferably is approximately 100 μm.

The said at least one silver halide emulsion layer can be composed in such a way that its adherence to the temporary base in wet state is less than that in dry state. Optionally, hygroscopic substances e.g. water-soluble organic hygroscopic compounds such as glycerol, or wetting and/or plasticizing agents can be added to said at least one silver halide emulsion layer to adjust its adherence.

Other temporary bases having a repelling power for wet gelatin coatings are e.g. a paper base coated with a polyethylene layer, a paper base impregnated with wax, a paper base coated with a layer of cellulose nitrate, a paper base coated with a layer of insolubilized polyvinyl alcohol, and a layer of alginic acid insolubilized with an alkaline earth metal salt. Temporary bases comprising a paper support should be removed before the photo-exposure, whereas transparent film bases may remain during the photo-exposure and are in that case removed afterwards.

The transfer of the transferable layers onto the aluminium foil can be carried out in an apparatus, in which the aluminium foil is moistened and the wet aluminium foil and the photosensitive layer packet are pressed together between rollers. An apparatus particularly suitable for use in transferring transferable layers from the temporary base to the wet aluminium foil has been described in U.S. Pat. No. 4,701,401. Suitable apparatus for that purpose are the AGFAPROOF TR unit and the AGFAPROOF TR S unit, both marketed by AGFA-GEVAERT, Belgium.

A wide choice of cameras for exposing the photosensitive silver halide emulsion exists on the market. Horizontal, vertical and darkroom type cameras and contact-exposure apparatus are available to suit any particular class of reprographic work. The photosensitive silver halide emulsion(s) used in the layer assemblages according to the present invention can also be exposed with the aid of i.a. laser recorders and cathode rays tubes.

The development and diffusion transfer are effected with the aid of an aqueous alkaline solution in the presence of at least one developing agent and at least one silver halide solvent. The developing agent(s) and/or the silver halide solvent(s) can be incorporated in the aqueous alkaline solution and/or in said at least one silver halide emulsion layer and/or in said intermediate layer and/or in a supplemental hydrophilic colloid layer in water-permeable relationship with said at least one silver halide emulsion layer. The latter supplemental hydrophilic colloid layer can be coated on top of said at least one silver halide emulsion layer remotest from said aluminium foil e.g. it can be provided between said temporary base and said at least one silver halide emulsion layer.

The silver halide solvent can also be incorporated at least in part in the silver-receptive stratum coated on the aluminium foil. When the aqueous alkaline solution does not comprise the developing agent(s), it is merely an activating liquid that is capable of dissolving the developing agent(s) contained in one of the layers.

The conventional developing agents for DTR-processing are a hydroquinone-type compound in combination with a secondary developing agent of the class of 1-phenyl-3-pyrazolidinone compounds and p-N-methyl-minophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Other suitable silver halide solvents are i.a. sulphites, amines, and such alkanolamines like e.g. ethanolamine, diethanolamine, triethanolamine, diisopropanolamine, 2-methyl-aminoethanol, 2-ethyl-aminoethanol, 2-dimethylaminoethanol, 2-diethyl-aminoethanol, 2-methyl-2-amino-1-propanol, 1-diethylamino-2-propanol, 3-diethylamino-1-propanol, isopropylaminoethanol, 3-amino-1-propanol, 2-methyl-2-amino-1,3-propanediol, benzyldiethanolamine, and 2-(hydroxymethyl)-2-amino-1,3-propanediol.

Further suitable silver halide solvents are those disclosed in "The Theory of the Photographic Process" 4th Ed., edited by T. H. James, pages 474–475. Further interesting silver halide solvents have been described in i.a. U.S. Pat. No. 2,857,276 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is even possible to incorporate at least one silver halide solvent into a suitable layer and add at least one other silver halide solvent to the developing solution.

The following quantitative ranges given for the developing agents, silver halide solvents, and sulphite apply to the amount of these compounds present as solutes in the aqueous alkaline solution during the DTR-processing, whether these compounds make part of the aqueous alkaline solution, which in that particular case actually is an aqueous alkaline developing solution, or were dissolved from the layers containing them upon application thereto of the aqueous alkaline solution, in which case it is an activating solution.

A suitable quantitative combination of hydroquinone and at least one secondary developing agent of the class of 1-phenyl-3-pyrazolidinones and p-N-methyl-aminophenol comprises hydroquinone in an amount not lower than 0.078 mole per liter of aqueous alkaline solution and the secondary developing agent(s) in an amount not lower than 0.0080 mole per liter, the molar ratio of hydroquinone to said secondary developing agent(s) not being lower than 9.7. Preferred amounts of hydroquinone are in the range of 0.05 mole to 0.25 mole per liter and preferred amounts of secondary developing agent(s) in the range of $1.8 \times 10^{-3}$ to $2.0 \times 10^{-2}$ mole per liter.

The aqueous alkaline solution may comprise sulphite e.g. sodium sulphite in an amount ranging from 40 g to 180 g per liter, preferably from 60 to 160 g per liter, and thiosulphate and/or thiocyanate in an amount ranging from 5 g to 20 g per liter.

The pH of the aqueous alkaline solution preferably is at least 12, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The aqueous alkaline solution may comprise such alkali-providing substances like hydroxides of sodium and potassium, alkali metal salts of phosphoric acid and/or silicic acid e.g. trisodium phosphate, orthosilicates, metasilicates, hydrodisilicates of sodium or potassium, and sodium carbonate. The alkali-providing substances can be substituted in part or wholly by alkanolamines.

The aqueous alkaline solution may comprise at least one alkanolamine to improve its life-time and performance for the DTR-process. Suitable alkanolamines are i.a. N,N,N-triethanolamine, 2-amino-2-hydroxymethyl-propan-1,3-diol, N-methyl-diethanolamine, N-ethyl-diethanolamine, diisopropanolamine, N,N-diethanolamine, 3,3'-amino-dipropanol, 2-amino-2-methyl-propan-1,3-diol, N-propyl-diethanolamine, N-butyl-diethanolamine, N,N-dimethyl-ethanolamine, N,N-diethylethanolamine, N,N-diethyl-isopropanolamine, 1-aminopropan-2-ol, N-ethanolamine, N-methyl-ethanolamine, N-ethyl-ethanolamine, 3-amino-propanol, 4-aminobutanol, and 5-amino-pentan-1-ol.

According to a preferred embodiment described in Research Disclosure 27939 (July 1987) pages 450–451 the aqueous alkaline solution comprises at least one tertiary alkanolamine having a pKa value higher than 8.5. More preferably, the solution comprises two or more tertiary alkanolamines having a pKa value higher than 9.0.

The aqueous alkaline solution may further comprise silver-image hydrophobizing compounds e.g. heterocyclic mercapto compounds. The addition of heterocyclic mercapto compounds more particularly a mercapto-1,3,4-thiadiazole to a developing liquid for the purpose of hydrophobizing the silver image formed according to the DTR-process on an aluminium foil has been described already in DE-A 1,228,927. Other suitable mercapto-thiadiazoles that can be added to the aqueous alkaline solution have been disclosed in U.S. Pat. No. 4,563,410. Another suitable hydrophobizing compound is 2-mercapto-5-heptyl-oxa-3,4-diazole.

These hydrophobizing compounds can be added to the aqueous alkaline solution in an amount of preferably 0.1 to 3 g per liter and preferably in admixture with 1-phenyl-5-mercaptotetrazole, the latter compound being used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Buffered stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus such as the CR 430, CR 740, or CR 1100-Processors marketed by AGFA-GEVAERT, Belgium. They are normally carried out at a temperature in the range of 18° C. to 30° C.

After formation of the silver image on the aluminium foil the excess of alkaline solution still present on the foil is eliminated, preferably by guiding the foil through a pair of squeezing rollers.

According to a preferred embodiment of uncovering the imaged aluminium foil the intermediate layer and the emulsion layer(s) wet with alkaline solution or moistened with unheated water or unheated aqueous medium applied subsequent to the removal from said alkaline solution are separated from the imaged aluminium foil by an airstream directed on an edge of said monosheet layer assemblage.

According to another embodiment of uncovering the imaged aluminium foil the developed monosheet layer assemblage is rinsed with unheated water or an unheated aqueous medium so that the intermediate layer and the emulsion layer(s) are removed from the imaged aluminium foil.

According to another embodiment of uncovering the imaged aluminium foil the intermediate layer and the emulsion layer(s) can be removed also by slightly agitating the developed monosheet layer assemblage while being dipped in unheated water or unheated aqueous medium or by slightly agitating a tray comprising unheated water or unheated aqueous medium in which said developed monosheet layer assemblage has been immersed. According to a convenient method of rinsing away said layers, the developed monosheet layer assemblage is held under a spray or jet of unheated water or unheated aqueous medium. The mechanical pressure of a water jet or spray directed onto these layers suffices to detach them from the aluminium foil. The unheated aqueous medium used to detach the intermediate layer and the emulsion layer(s) by rinsing may comprise ingredients such as i.a. weak acidifying agents, wetting agents, and hardeners including latent hardeners.

According to a further embodiment of uncovering the imaged aluminium foil the monosheet layer assemblage is pressed with its side showing the emulsion layer(s) while being moistened with unheated water or with unheated aqueous medium against a receiving sheet such as e.g. a paper or film base coated with a hardened gelatin layer comprising a matting agent or against a porous web as described in Research Disclosure 23017 (June 1983) pages 223–4 and said imaged aluminium foil is peeled off from the emulsion layer(s) and the intermediate layer, which are supported by the receiving sheet and strongly adhere thereto. According to an alternative embodiment the emulsion layer(s) and the intermediate layer can also be removed by scraping off or by wiping off e.g. with a sponge.

According to an alternative method of separating said at least one silver halide emulsion layer and said intermediate layer from the imaged hydrophilic grained and anodized surface, the monosheet layer assemblage is placed with its side showing said at least one silver halide emulsion layer during the period of time that starts with the application of said aqueous alkaline solution and ends with said formation of a silver image on said hydrophilic grained and anodized surface in contact with a receiving means, said at least one silver halide emulsion layer and said intermediate layer after said formation of a silver image while still being wet with said aqueous alkaline solution, having an adherence to said receiving means that is stronger than that to the imaged hydrophilic grained and anodized surface. Next, said at least one silver halide emulsion layer and said intermediate layer adhering to and supported by said receiving means are peeled off from the imaged hydrophilic grained and anodized surface. According to this method the emulsion layer(s) and intermediate layer are separated from the imaged hydrophilic grained and anodized surface after the silver image has been formed thereon and while they are still wet with said aqueous alkaline solution. For carrying out this process the photo-exposed monosheet layer assemblage and a receiving means e.g. a paper or film base coated with a hardened gelatin layer comprising a matting agent can be introduced in a processing device through different inlet openings and after completion of the development and of the image transfer pressed together in the nip of two rollers. When the contacting monosheet layer assemblage and the receiving means leave the nip between the two rollers, a suitable and appropriately mounted separating blade can separate the imaged aluminium foil from the receiving means, to which said intermediate layer and said emulsion layer(s) remain adhering. As a consequence the thus obtained bared aluminium foil carrying the transferred silver image does not need any further rinsing, although rinsing with water is possible, of course, if desired.

It is common practice in the art to subject the imaged surface of the aluminium foil to a chemical treatment that increases the hydrophilicity of the non-silver image parts and the oleophilicity of the silver image.

This chemical after-treatment is preferably carried out with a lithographic composition often called fixer, which comprises at least one compound enhancing the ink-receptivity and/or lacquer-receptivity of the silver image, and also comprises at least one compound that improves the ink-repelling characteristics of the aluminium. In U.S. Pat. No. 4,563,410 an interesting method for hydrophobizing the silver image has been described.

Suitable ingredients for the fixer are e.g. organic compounds containing a mercapto group such as dodecylmercaptans, benzothiazole-2-thiol, 1,3,4-thiadiazole-2-thiol, 1-phenyl-1-H-tetrazole-5-thiol, triazinethiols e.g. 1-octyl-1,2,4,5-tetrahydro-S-triazine-5-thiol, and compounds containing a thioacid or a thioamide group. Additives improving the oleophilic ink-repellency of the bare anodized aluminium foil areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, and polyvinyl alcohol. Optionally, hygroscopic substances e.g. sorbitol, glycerol, tri(hydroxyethyl)ester of glycerol, and turkey red oil may be added. Furthermore, phosphoric acid and cationic surface-active compounds such as hexadecyl trimethyl ammonium bromide can also be added to the fixer. A suitable fixer is e.g. a composition comprising a solution of 1-octyl-1,2,4,5-tetrahydro-S-triazine-5-thiol in acetone or a suspension thereof in a solution of gum arabic. Other suitable fixers have been described in i.a. U.S. Pat. No. 4,062,682 and U.S. Pat. No. 4,563,410.

At the moment the treatment with the fixer is started the surface carrying the silver pattern may be in dry or wet state. In general, the treatment with the fixer does not take long, usually not longer than about 30 seconds and it may be carried out immediately after the processing and uncovering steps.

The fixer can be applied in different ways such as by rubbing with a roller, by wiping with an absorbent means e.g. with a plug of cotton or sponge, or by dipping the material to be treated in the fixer. The image-hydrophobizing step of the printing plate may also proceed automatically by conducting the printing plate through a device having a narrow channel filled with the fixer and conveying the printing plate at the end of the channel between two squeezing rollers removing the excess of liquid. Suitable devices for automatic treatment with a fixer are the CRF 45 and CRF 85 fixing units, both marketed by AGFA-GEVAERT, Belgium.

As soon as the aluminium foil carrying the silver image has been treated with the fixer, it is ready to be inked and used as a printing plate so that a treatment thereof with a lacquer composition for strengthening the printing areas is not necessary. The printing plate has to be wet at the stage the greasy printing ink is applied. This is a generally known fact in the art and it is usual to apply an aqueous liquid before the printing ink is applied. This can be done by means of a wet sponge or by means of the fountain arrangements (dampening system) of the printing machine.

For the production of long-run printing plates requiring more than 100,000 prints a second after-treatment consisting in applying a lacquer onto the silver image areas may be advisable. For this purpose, lacquers based on phenol- or cresol-formaldehyde alkyd resins and/or epoxyresins are commonly used.

Another useful resin for such a lacquer is a mixture of homopolymers and copolymers of styrene, ortho-, meta-, or para-vinyltoluene and indene units. Cyclohexanone can be used as solvent and linseed oil as plasticizer. Examples of suitable lacquer compositions have been described in i.a. GB-A 968,706 and 1,071,163 and in CA-A 686,284.

A lithographic composition in which the fixer and lacquer are combined to one composition has been described in e.g. GB-A 969,072.

The following examples illustrate the present invention.

EXAMPLE 1

Three identical photosensitive monosheet layer assemblages were made as follows.

An aluminium foil having a thickness of 0.20 mm was grained, anodized, and sealed according to the method described in Example 1 of U.S. Pat. No. 3,861,917. The centre line average value obtained by the graining was 0.5 $\mu$m. The anodization layer having a weight of 2.7 g per m2 was coated with a silver-receptive stratum from a silver sol in water comprising no binder, prepared according to the Carey Lea method, the resulting stratum having a weight in dried condition of 4 mg of silver per m2.

The silver-receptive stratum was covered with a substantially unhardened photosensitive negative-working cadmium-free gelatin silver chlorobromoiodide emulsion layer (97.98/2/0.02 mol %), the silver halide being coated in an amount corresponding to 2.40 g of silver nitrate per m2 and the gelatin content of the resulting photosensitive emulsion layer being 1.58 g/m2.

The resulting 3 identical photosensitive monosheet layer assemblages are called "Comparison A", "Comparison B", and "Comparison C" respectively hereinafter.

A photosensitive monosheet layer assemblage called "Invention" was then made in the same way as described for Comparison A, B, and C, with the only difference that an intermediate layer comprising hydrophobic polymer beads was provided between the silver-receptive stratum and the photosensitive emulsion layer. The intermediate layer was coated on the dry silver-receptive stratum from a composition comprising 50 ml of a 20% dispersion of polymethyl methacrylate beads in a mixture of equal volumes of water and ethanol, which beads have been prepared as described in Preparation example 1 hereinbefore and have an average diameter of 1.0 $\mu$m, 2.5 g of Helioechtpapierrot BL (trade mark for a dye sold by BAYER AG, D-5090 Leverkusen, West-Germany), 2.5 g of saponine, 1.25 g of sodium oleylmethyltauride, and 300 ml of demineralized water in such a way that the resulting dried layer comprised 0.5 g of polymethyl methacrylate beads per m2.

The 4 photosensitive monosheet layer assemblages were exposed identically through a contact screen in a process-camera and immersed for 8 s at 25° C. in a freshly made developing solution having the following ingredients in a CR 430 processor marketed by AGFA-GEVAERT, Belgium:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 2 g |
| demineralized water to make | 1000 ml |
| pH (25° C.) = 13 | |

The initiated diffusion transfer was allowed to continue for 30 s to form a silver image on the aluminium foil.

To remove the developed silver halide emulsion layer and the intermediate layer (Invention) from the imaged aluminium foil, each of the 4 developed monosheet layer assemblages was rinsed for 30 s with a water jet. In case the emulsion layer did not detach with unheated water the test was repeated with a fresh identical layer assemblage and the temperature of the rinsing water was enhanced. The temperature used for each of the 4 monosheet layer assemblages is specified in Table 1 hereinafter.

Next, the imaged surface of the aluminium foil was rubbed with one of the fixers A or B as specified in Table I hereinafter to enhance the water-receptivity of the non-image areas and to make the image areas oleophilic ink-receptive. Fixer A had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

The composition of Fixer B was identical to that of Fixer A with the only difference that Fixer B additionally comprised 20 g of trypsin per liter.

Each of the printing plates obtained was placed on an Heidelberg offset printing press, type GTO, marketed by HEIDELBERGER DRUCKMASCHINEN AG, D-6900 Heidelberg, West-Germany.

Each printing plate was inked with a commercially available KAST+EHINGER 123W ink and then used for printing copy sheets of paper.

The lithographic quality of each 25th print was evaluated as for its lithographic quality. The results of this evaluation are given in the following Table 1. Four levels of appreciation of the lithographic quality were attributable. The term "perfect" was used when the image printed on the paper was an exact reproduction of the silver image on the printing plate, had a perfect density, and showed no deficiencies such as pin-holes. The term "good" could be used when the image was an almost exact reproduction of the silver image on the printing plate, had an acceptable density, and showed only few deficiencies. The term "bad" was used when the printed image was a recognizable reproduction, but had an unpleasantly weak density, and showed many deficiencies. The term "very bad" was used when the printed image was unrecognizable and useless.

TABLE 1

| | Temperature of rinsing water | Fixer | Lithographic quality |
|---|---|---|---|
| Comparison A | 20° C. | A | very bad |
| Comparison B | 50° C. | A | bad |
| Comparison C | 50° C. | B (trypsin) | perfect |
| Invention | 20° C. | A | perfect |

With the "Invention" printing plate a run of 100,000 prints on paper was carried out. The quality of the last print was still perfect. No abnormal wear or decline in image sharpness was visible.

EXAMPLE 2

A series of photosensitive monosheet layer assemblages comprising an intermediate layer comprising hydrophobic polymethyl methacrylate beads prepared as described in Preparation example 1 hereinbefore and having an average diameter of 1.0 μm were made as described in Example 1, the only differentiation between the photosensitive monosheet layer assemblages being that the weight of polymethyl methacrylate beads present per m2 of dried intermediate layer was different as indicated in Table 2 hereinafter.

The intermediate layer was covered with a photosensitive silver chlorobromoiodide emulsion layer as described in Example 1.

The procedure of exposure, DTR-development, treatment with fixer A, and printing described in Example 1 was repeated for each of the layer assemblages.

The lithographic quality of each 25th print was evaluated as described in Example 1. The coating weight of the intermediate layer and the results of this evaluation are given in Table 2. Furthermore, the sharpness of the silver image on the imaged aluminium foil and of each 25th print obtained therefrom is measured with the aid of the FOGRA Precision Measuring Strip PMS I as described in Fogra Praxis Report No 34 published by Deutsche Forschungsgesellschaft für Druck- und Reproduktionstechnik, P.O. 800469, 8000 Munich 80 - W.Germany.

Table 2 also compares the yield of silver (expressed in silver nitrate). By yield of silver is meant the percent ratio by weight of transferred silver present on the aluminium foil versus the silver of the transferable silver ucomplexes present in the emulsion layer. In the column entitled "wash-off" an appreciation is given for the removability of the intermediate layer and the silver halide emulsion layer with a jet of unheated water.

TABLE 2

| Coating weight of beads (g/m2) | Sharpness Printing plate | Yield of silver | wash-off | Lithographic quality |
|---|---|---|---|---|
| 0.0 | 6 μm | 55% | very bad | very bad |
| 0.2 | 6–8 μm | 59% | good | good |
| 0.5 | 8 μm | 51% | good | perfect |
| 1.0 | 8 μm | 50% | perfect | perfect |

EXAMPLE 3

A photosensitive monosheet layer assemblage was made as follows.

An aluminium foil coated with a silver-receptive stratum, both as described in Example 1, was covered in the given sequence at the side of the stratum with an intermediate layer and an emulsion layer as described in Example 1.

The intermediate layer was coated on the dry silver-receptive stratum from a composition comprising 50 ml of a 20% dispersion of polymethyl methacrylate beads in a mixture of equal volumes of water and ethanol, which beads have been prepared as described in Preparation example 1 hereinbefore and have an average diameter of 1.0 μm, 50 ml of a 5% aqueous solution of polyvinyl alcohol having a molecular weight of 10,000 and comprising 95 mol % of vinyl alcohol units and 5 mol % of vinyl acetate units, 2.5 g of Helioechtpapierrot BL (trade mark for a dye sold by BAYER AG, D-5090 Leverkusen, West-Germany), 2.5 g of saponine, 1.25 g of sodium oleylmethyltauride, and 300 ml of demineralized water in such a way that the resulting dried layer comprised 0.5 g of polymethyl methacrylate beads and 0.125 g of polyvinyl alcohol per m2.

The procedure of exposure and DTR-development described in Example 1 was repeated. The developed silver halide emulsion layer and the intermediate layer while still being wet with aqueous alkaline developing solution were removed from the imaged aluminium foil with an airstream as described in Example 1. Next, the imaged surface of the aluminium foil was rinsed with water and rubbed with fixer A described in Example 1. Printing with the printing plate obtained was then carrried out as described in Example 1 and the lithographic quality of the 25th print was evaluated also as described in Example 1. The results are listed in Table 3.

TABLE 3

| average diameter of beads | Yield of silver | wash-off | Lithographic quality |
| --- | --- | --- | --- |
| 1.0 | 51% | very good | perfect |

We claim:

1. Method for making lithographic aluminium offset printing plates according to the DTR-process comprising the steps of:
   (a) photo-exposing a photosensitive monosheet layer assemblage comprising:
      a hydrophilic grained and anodized aluminium foil,
      an intermediate layer consisting essentially of hydrophobic polymer beads prepared by polymerization of at least one ethylenically unsaturated monomer and having an average diameter not lower than 0.2 μm, and
      at least one silver halide emulsion layer,
   (b) applying an aqueous alkaline solution to the photo-exposed silver halide emulsion layer in the presence of at least one developing agent and at least one silver halide solvent to form a silver image and to allow unreduced silver halide or complexes formed thereof to diffuse image-wise from the developed silver halide emulsion layer to said hydrophilic grained and anodized aluminium foil to produce thereon a silver image, and
   (c) separating said at least one emulsion layer and said intermediate layer from the imaged hydrophilic grained and anodized aluminium foil.

2. A method according to claim 1, wherein in step (c) said separating is accomplished by the steps of:
   bringing said monosheet layer assemblage with its side showing said at least one emulsion layer during the period of time starting with the application of said aqueous alkaline solution and ending with said formation of a silver image on said hydrophilic grained and anodized surface in contact with a receiving means, said at least one emulsion layer and said intermediate layer being wet with said aqueous alkaline solution having an adherence to said receiving means that is stronger than that to the imaged hydrophilic grained and anodized aluminium foil and
   peeling off said at least one emulsion layer and said intermediate layer adhering to said receiving means from the imaged hydrophilic grained and anodized aluminium foil.

3. A method according to claim 1, wherein in step (c) said separating is accomplished by
   detaching said at least one emulsion layer and said intermediate layer from the imaged hydrophilic grained and anodized aluminum foil with the aid of unheated water or unheated aqueous medium.

4. A method according to claim 1, wherein in step (c) said separating is accomplished by
   detaching said at least one emulsion layer and said intermediate layer, while still being wet with alkaline solution or while being wet with unheated water or an unheated aqueous medium applied thereto subsequent to the removal of said monosheet layer assemblage from said alkaline solution, from the imaged hydrophilic grained and anodized aluminum foil with the aid of an air current directed onto an edge of said monosheet layer assemblage.

5. A method according to claim 3, wherein said at least one emulsion layer and said intermediate layer are separated from the imaged hydrophilic grained and anodized aluminium foil by rinsing with a spray or jet of unheated water or unheated aqueous medium directed onto said at least one emulsion layer and said intermediate layer.

6. A method according to claim 3, wherein said at least one emulsion layer and said intermediate layer are separated from the imaged hydrophilic grained and anodized aluminium foil by pressing said monosheet layer assemblage with its side showing said at least one emulsion layer, while being moistened with unheated water or unheated aqueous medium, against a receiving sheet and peeling off said receiving sheet together with said at least one emulsion layer and said intermediate layer, which remain strongly adhering to said receiving sheet, from said imaged aluminium foil.

7. A method according to claim 1, wherein said intermediate layer in addition to said hydrophobic polymer beads also comprises an aqueous dispersion of alkali-soluble hydrophobic polymer particles, all particles having an average particle size not lower than 0.2 μm.

8. A method according to claim 1, wherein said hydrophobic polymer beads can be loaded with a dye for antihalation purposes.

9. A method according to claim 1, wherein said silver image is formed on said hydrophilic grained and anodized surface under the catalytic influence of development nuclei for precipitation of silver from diffusing water-soluble silver complexes.

10. Photosensitive monosheet layer assemblage for making a lithographic aluminium printing plate according to the DTR-process, said assemblage comprising in the given sequence a hydrophilic grained and anodized aluminium foil and at least one silver halide emulsion layer, wherein an intermediate layer consisting essentially of hydrophobic polymer beads prepared by polymerization of at least one ethylenically unsaturated monomer and having an average diameter not lower than 0.2 μm is provided between said hydrophilic grained and anodized aluminium foil and said at least one silver halide emulsion layer.

11. A photosensitive monosheet layer assemblage according to claim 10, wherein said intermediate layer in dry condition comprises said hydrophobic polymer beads in an amount of up to 80% of its total weight.

12. A photosensitive monosheet layer assemblage according to claim 10, wherein said intermediate layer has been coated at a ratio of from about 0.1 to about 5 g/m2.

13. A photosensitive monosheet layer assemblage according to claim 10, wherein said intermediate layer comprises up to 20% by weight of any nonproteinic hydrophilic film-forming polymer.

14. A photosensitive monosheet layer assemblage according to claim 10, wherein said anodized surface of said aluminium foil has been sealed.

15. A photosensitive monosheet layer assemblage according to claim 10, wherein on top of said at least one silver halide emulsion layer there is a temporary base.

16. A photosensitive monosheet layer assemblage according to claim 15, wherein said temporary base is a cellulose triacetate or polyethylene terephthalate film base.

17. A photosensitive monosheet layer assemblage according to claim 10, wherein the anodization layer of said aluminium foil is coloured in the mass with an antihalation dye or pigment.

18. A photosensitive monosheet layer assemblage according to claim 10, wherein said hydrophilic grained and anodized aluminium foil has been provided with a very thin antihalation coating of a dye or pigment.

19. A photosensitive monosheet layer assemblage according to claim 10, wherein a silver-receptive stratum containing development nuclei for precipitation of silver from diffusing water-soluble silver complexes has been coated on said hydrophilic grained and anodized aluminium foil.

20. A photosensitive monosheet layer assemblage according to claim 19, wherein said silver-receptive stratum incorporates at least one antihalation dye or pigment.

21. A photosensitive monosheet layer assemblage according to claim 10, wherein said intermediate layer comprises at least one antihalation dye or pigment.

* * * * *